United States Patent [19]

Takato et al.

[11] Patent Number: 4,912,429

[45] Date of Patent: Mar. 27, 1990

[54] OPERATIONAL AMPLIFIER

[75] Inventors: Kenji Takato; Toshiro Tojo; Kazumi Kinoshita; Yuzo Yamamoto, all of Kawasaki, Japan

[73] Assignee: Fujitsu Limited, Kawasaki, Japan

[21] Appl. No.: 326,177

[22] Filed: Mar. 20, 1989

[30] Foreign Application Priority Data

Mar. 19, 1988 [JP] Japan .................................. 63-64717

[51] Int. Cl.[4] .............................................. H23F 3/45
[52] U.S. Cl. ..................................... 330/261; 379/395
[58] Field of Search ............... 330/255, 261, 267, 273, 330/297; 379/395

[56] References Cited

PUBLICATIONS

Lyerly, "Ultrahigh Gain Direct-Coupled Differential Amplifier", *IBM Technical Disclosure Bulletin*, vol. 14, No. 3, Aug. 1971, pp. 964–965.

*Primary Examiner*—James B. Mullins
*Attorney, Agent, or Firm*—Staas & Halsey

[57] ABSTRACT

An operational amplifier for producing an output signal representing the voltage differential between two input signals is powered by first, second and third power sources respectively having high, intermediate and low output voltage levels. A voltage buffer circuit, which is connected to the second power source, interconnects a constant current source, which is connected to the first power source, and an amplifier means, which is connected to the third power source, and separates the constant current source from the third power source. A differential amplifier in the amplifier means responds to the two input signals for producing a voltage differential output signal, and an output circuit connected between the second and third power sources receives the voltage differential output signal of the differential amplifier for producing the voltage differential output signal of the operational amplifier.

13 Claims, 7 Drawing Sheets

OPERATIONAL AMPLIFIER

BACKGROUND OF THE INVENTION

1. Field of the Invention

The present invention relates to an operational amplifier, more particularly to an operational amplifier able to be used under conditions where there are a plurality of types of power sources in existence, such as in a telephone exchange.

For example, the subscriber line interface circuits or trunk circuits of time division exchanges have been increasingly formed by electronic circuits in recent years, with frequent use being made of operational amplifiers and replacement of conventional coils, transformers, and other electromagnetic components with semiconductor circuits. In such case, it is necessary to supply a speech current to the subscriber's telephone set just as in the past, so that conventional interface conditions have to be maintained as they are. That is, the electronic circuits are placed under what is for them considerably a high voltage environment of a power source voltage of $-48$ V. The present invention concerns an operational amplifier suitable for operation under voltage environments different from general use.

2. Description of the Related Art

The operational amplifier spoken of in the present invention is, for example, driven by a power source $V_{BB}$ having a negative voltage with respect to the ground GND. This power source $V_{BB}$ is, in a exchange as mentioned earlier, $-48$ V. Since general purpose operational amplifiers are driven by voltages of about 36 V, this type of operational amplifier is not readily available commercially and is higher in cost. Further, it has several problems technically. Details of these problems will be discussed later, but briefly the first of these problems is that the voltage range of the input signal of the operational amplifier is narrow, the second is that the output signal of the operational amplifier only reaches a level about 1.0 V lower than the level of the ground GND, the third is that the Early effect causes the operational amplifier to become unstable in operation, and the fourth is that the idling current of the operational amplifier is large.

SUMMARY OF THE INVENTION

Therefore, the present invention has as its object the provision of an operational amplifier having the advantages of an expanded voltage range of the input signal, a sufficient amplitude of the output signal, elimination of instability of operation due to the Early effect, and a smaller idling current.

To achieve the above-mentioned object, the present invention constructs an operational amplifier by an input stage, second stage, and output stage, drives the input stage and second stage as classed into a first power source area and a second power source area differing from each other in the voltage range, and drives the output stage by the first power source area. Further, a voltage buffer unit is inserted between a first circuit section driven by a first stage and a second circuit section driven by a second power source.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the related art and the disadvantages therein will be described with reference to the related figures.

Figure 1:
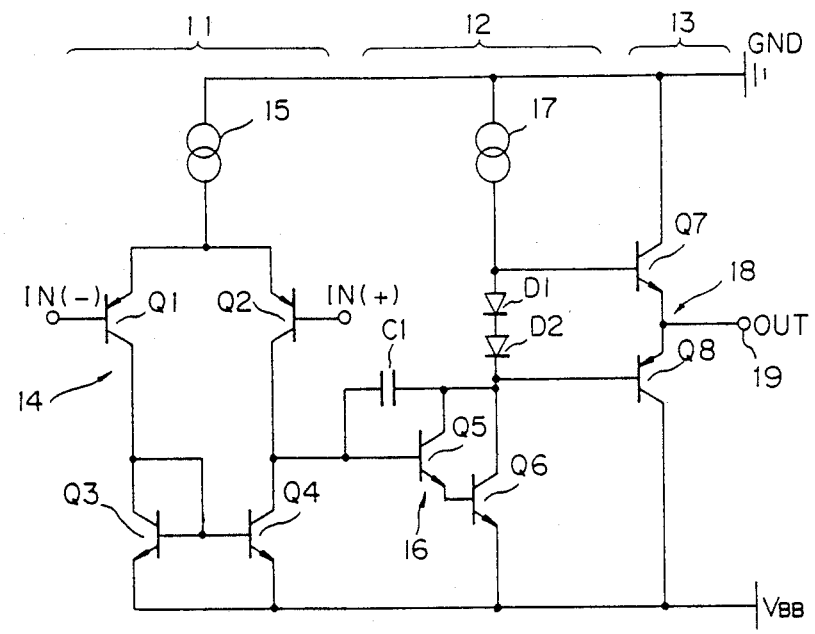
FIG. 1 is a view of an example of a conventional operational amplifier.

FIG. 1 is a view of an example of a conventional operational amplifier. In the figure, the operational amplifier 10 includes, generally, an input stage 11, second state 12, and output stage 13. The second stage is not limited to a single stage, i.e., there may be a plurality of second stages. The input stage 11 includes a differential amplifier 14 which receives an input signal at an inverting input IN ($-$) and a non-inverting input ($+$). The differential amplifier 14 includes PNP transistors Q1 and Q2 with emitters commonly connected and transistors Q3 and Q4 which form an active load for producing the output. Further, the input stage 11 has included therein an initial stage constant current source 15 for supplying bias current.

The output of the input stage 11 is supplied to the second stage 12 and particularly to the voltage gain circuit 16. The voltage gain circuit 16 includes Darlington connection NPN transistors Q5 and Q6 and a phase compensation capacitor C1. Further, the second stage 12 has included therein a second stage constant current source 17 for supplying a bias current.

The output stage 13 includes an emitter follower 18 which has an NPN transistor Q7 and a PNP transistor Q8 and generates an output signal OUT in response to the output of the second stage 12. Reference numeral 19 is an output terminal of the output stage 13. To prevent the occurrence of so-called cross-over distortion in the output signal OUT, the second stage 12 is provided with diodes D1 and D2. Note that the stationary current of the transistors Q7 and Q8 is determined by suitably setting the ratio of the emitter areas of the diodes D1 and D2 to the emitter areas of the transistors Q7 and Q8.

The operational amplifier 10, as mentioned earlier, is driven by a power source $V_{BB}$ having a negative voltage with respect to the ground GND. This $V_{BB}$ is $-48$ V in an exchange, as mentioned before, while a general purpose operational amplifier is driven by about 36 V, so this type of operational amplifier 10 is not readily available commercially and is higher in cost.

Figure 2:
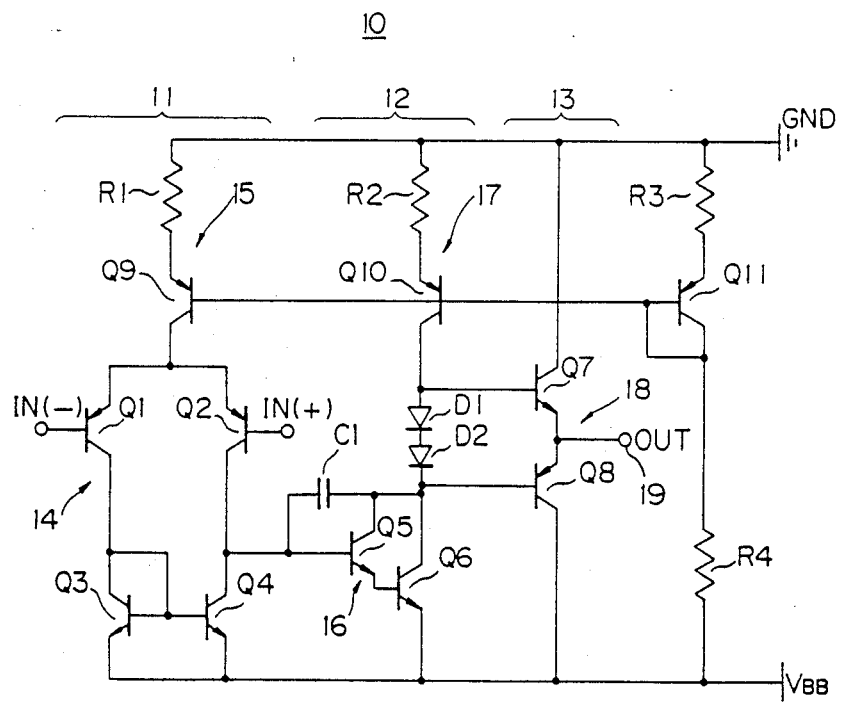
FIG. 2 is a view showing in further detail the operational amplifier of FIG. 1.

FIG. 2 is a view showing in further detail the operational amplifier of FIG. 1 and shows in particular the input stage constant current source 15 and the second stage constant current source 17. These constant current sources are constructed in the form of general current mirror circuits and include the transistors Q9 and the diode connected transistor Q11 and the resistors R1, R2, R3 and R4.

With the above-mentioned conventional operational amplifier 10, there is a first problem of a narrow input voltage range. In other words, in the operational amplifier 10, due to the operating voltage of the input stage constant current source 15 and the base-emitter voltage $V_{BE}$ of the transistor Q1, normal operation cannot be expected unless the input signal is of a level about 1.5 V ($=V_{R1}+V_{CE9}+V_{BE1}$) lower than the ground GND. Here, $V_{R1}$ is the voltage drop of the resistor R1, $V_{CE9}$ is the collector-emitter voltage of the transistor Q9, and $V_{BE1}$ is the base-emitter voltage of the transistor Q1.

Further, with the conventional operational amplifier 10, there is the second problem that the output signal OUT from the output stage 13 will only rise to a level about 1.0 V ($=V_{R2}+V_{CE10}+V_{BE7}$) lower than the GND. Here, $V_{R2}$ is the voltage drop of the resistor R2, $V_{CE10}$ is the collector-emitter voltage of the transistor Q10, and $V_{BE7}$ is the base-emitter voltage of the transistor Q7.

Still further, with the operational amplifier 10, there is the third problem that the Early effect causes the circuit operation to become unstable. That is, the operational range of the operational amplifier 10 is GND$-V_{BB}$, a fairly wide range, so the collector-emitter voltage $V_{CE}$ of the transistor Q9 in the input stage 11 fluctuates over a large range. Here, if the collector-emitter voltage fluctuates over a large range, the current amplification factor of the transistor Q9 fluctuates (Early effect). This is equivalent to deviation of the mirror ratio of the above-mentioned current mirror circuit (constant current sources 15 and 17). The bias current of the input stage 11 fluctuates due to the operating voltage of the operational amplifier and the operation becomes unstable.

The open gain (before compensation by the capacitor C1) of the operational amplifier is increased by an increase of a current flowing in the input stage 11. Due to the increase of the open gain, if the compensation by the capacitor C1 is not sufficient, the operation becomes unstable, such as by going into oscillation.

Further, there is the fourth problem that the operational amplifier 10 has a large idling current. The idling current is the current which flows at all times in the operational amplifier 10 regardless of whether the operational amplifier 10 is operating or not operating and includes the currents of the constant current source 15 of the input stage 11, the constant current source 17 of the second stage 12, and the current flowing through the output stage 13. The idling current of the output stage 13 is determined by the factor-in-device structure of the transistors Q7 and Q8 and the diodes D1 and D2.

A detailed explanation will be given below of the operational amplifier of the present invention which can simultaneously resolve the above problems.

Figure 3:
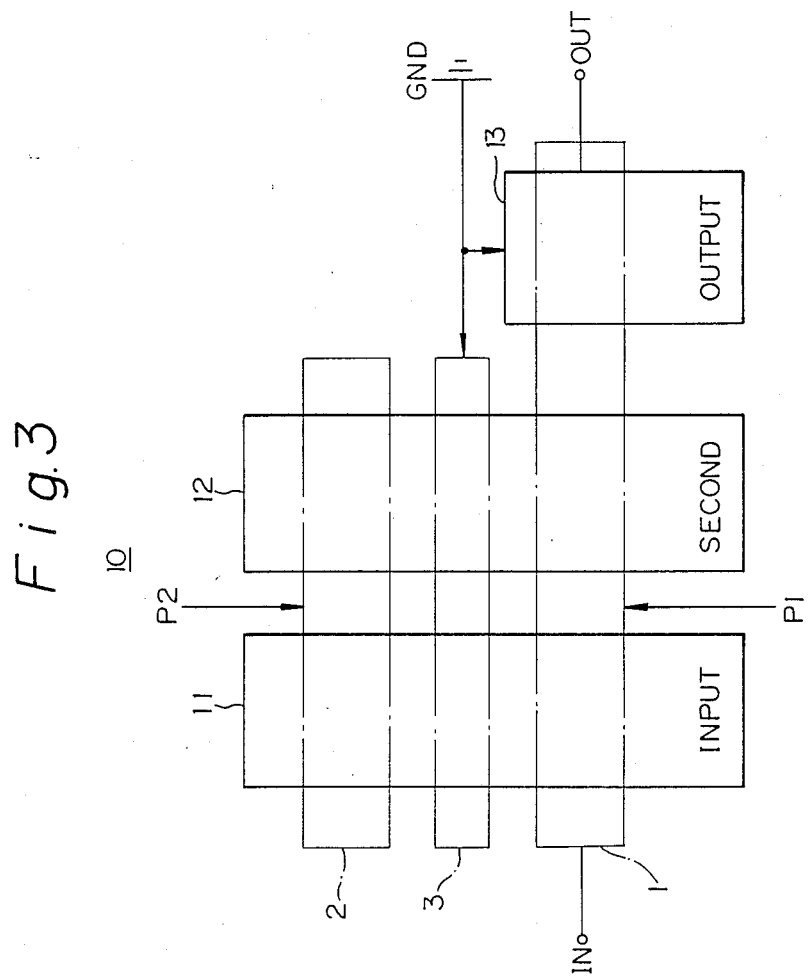
FIG. 3 is a view showing the principal and construction of an operational amplifier according to the present invention.

FIG. 3 is a view showing the principle and construction of an operational amplifier according to the present invention. The operational amplifier 10 shown in FIG. 3 includes an input stage 11 which receives an input signal IN, a second stage 12 which receives the output of the input stage 11, and an output stage 13 which receives the output of the second stage 12 and sends out an output signal OUT. Further, the above-mentioned input stage 11 and second stage 12 are driven classed as an area operating by a first power source P1 and an area operating by a second power source P2 having mutually different ranges of voltage, thereby forming a first circuit portion 1 driven by the first power source P1 and a second circuit portion 2 driven by the second power source P2. A voltage buffer unit 3 is provided between the two.

Figure 4:
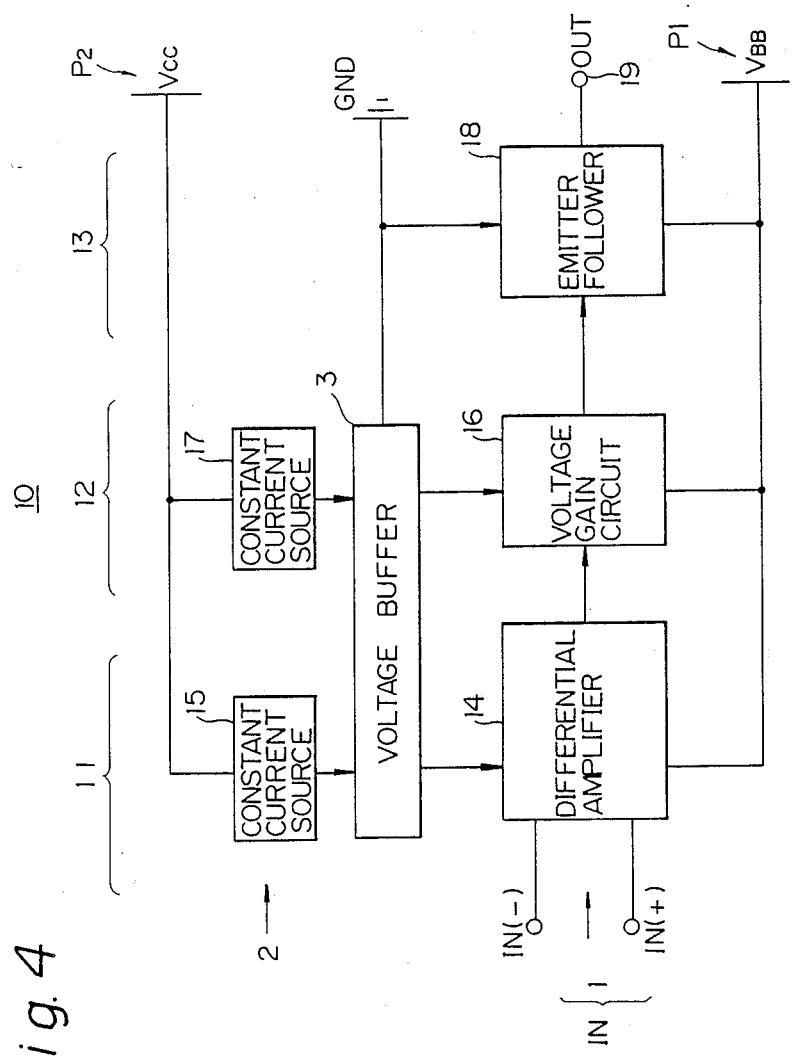
FIG. 4 is a more specific view of the principle and construction of an operational amplifier according to the present invention.

FIG. 4 is a more specific view of the principle and construction of an operational amplifier according to the present invention. Note that constituent elements the same as the previously mentioned are shown with the same reference numerals or symbols. First, the present invention assumes use, as with an exchange etc., under conditions of the provision of not only a first power source $V_{BB}$ (P1) which supplies negative voltage, but also a second power source $V_{CC}$ (P2) which supplies a positive voltage. $V_{BB}$ is the afore-mentioned $-48$ V, and $V_{CC}$ is, for example, $+5$ V for use by a logical circuit.

The constant current source 15 of the input stage 11 is operated by the second power source $V_{CC}$ and the ground GND. The constant current source 17 of the second stage 12 is also operated by the second power source $V_{CC}$ and the ground GND. On the other hand, the differential amplifier 14 and the voltage gain circuit 16, respectively included, in the input stage 11 and the second stage 12, are operated by the ground GND and the first power source $V_{BB}$. The output stage 13 is the same as in the prior art.

First, the voltage range of the input signal is pulled up to a level slightly down from the ground GND.

Further, the output amplitude is pulled up to a level only slightly down from the GND.

The buffer function given to the input stage constant current source 15 (voltage buffer portion 3) makes the circuits less susceptible to the Early effect.

Still further, the idling current source is powered by the second power source $V_{CC}$($V_{CC}<V_{BB}$) and therefor its operation voltage is only about 1/10 of the first power source $V_{BB}$ and the idling power correspondingly is much smaller.

Figure 5:
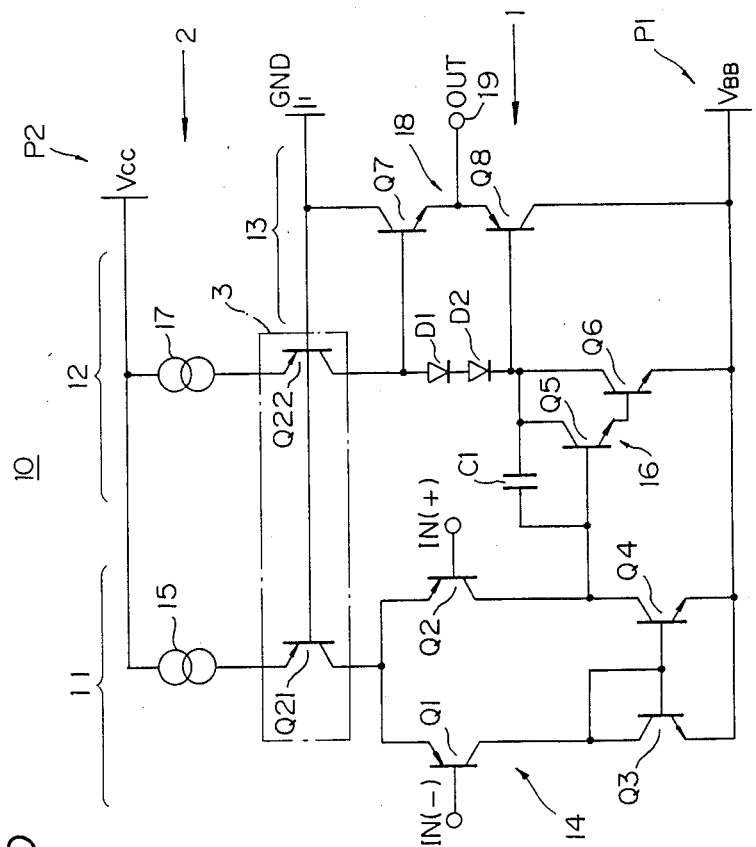
FIG. 5 is a view showing an embodiment according to the present invention.

FIG. 5 is a view showing an embodiment according to the present invention. The constant current source 15 has connected thereto a grounded base type PNP transistor Q21, while the constant current source 17 has connected thereto a grounded base type PNP transistor Q22, the transistors Q21 and Q22 functioning as the voltage buffer portion 3. The voltage buffer portion 3 blocks the Early effect caused by shifting of the operating point of the operational amplifier 10. Even through the transistors Q21 and Q22 are provided, the currents from the constant current sources 15 and 17 are supplied in total, except for the amount of reduction due to the base currents of the transistors Q21 and Q22, to the differential amplifier 14 and the voltage gain circuit 16.

Figure 6:
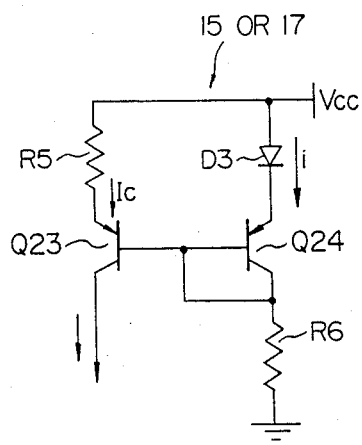
FIG. 6 is a circuit diagram of an example of a constant current source employed in the embodiment of FIG. 5.

FIG. 6 is a circuit diagram of an example of the constant current sources of FIG. 5 and is common for both of the constant current sources 15 and 17. As shown in the figure, a diode D3, transistor Q24, and resistor R6 are connected between the second power source $V_{CC}$ and the ground GND. Due to the voltage $V_{D3}$ generated across the diode D3 due to the current i flowing through here, the following constant current flows:

$$I_c = V_{D3}/R5$$

Note that instead of the diode D3, a resistor (R3) such as shown in FIG. 2 may be used, but if the diode D3 is used, there is the advantageous effect of reducing the noise entering in from the second power source $V_{CC}$.

Figure 7:
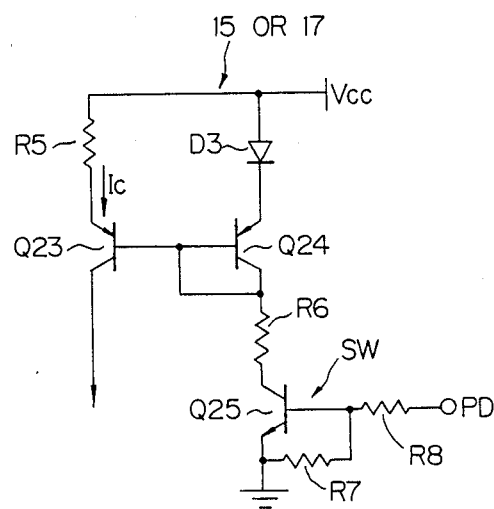
FIG. 7 shows an example of an application according to the present invention.

FIG. 7 shows an example of an application according to the present invention. It shows the constant current source of FIG. 6 with the further addition of a transistor switch SW. The switch SW is constituted by a transistor Q25 and resistors R7 and R8. The constant current $I_c$ may be turned on and off by this switch SW. The on-off signal is a power down signal PD which is a transistor-transistor-logic (TTL) level logical input. This is made possible by the provision of the second power source $V_{CC}$ in the operational amplifier of the invention. Therefore, the operational amplifier 10 can be stopped in operation temporarily. This temporary stop of operation is frequently performed due to operational demands on the operational amplifier used for battery feed circuit of an exchange, for example.

Figure 8:
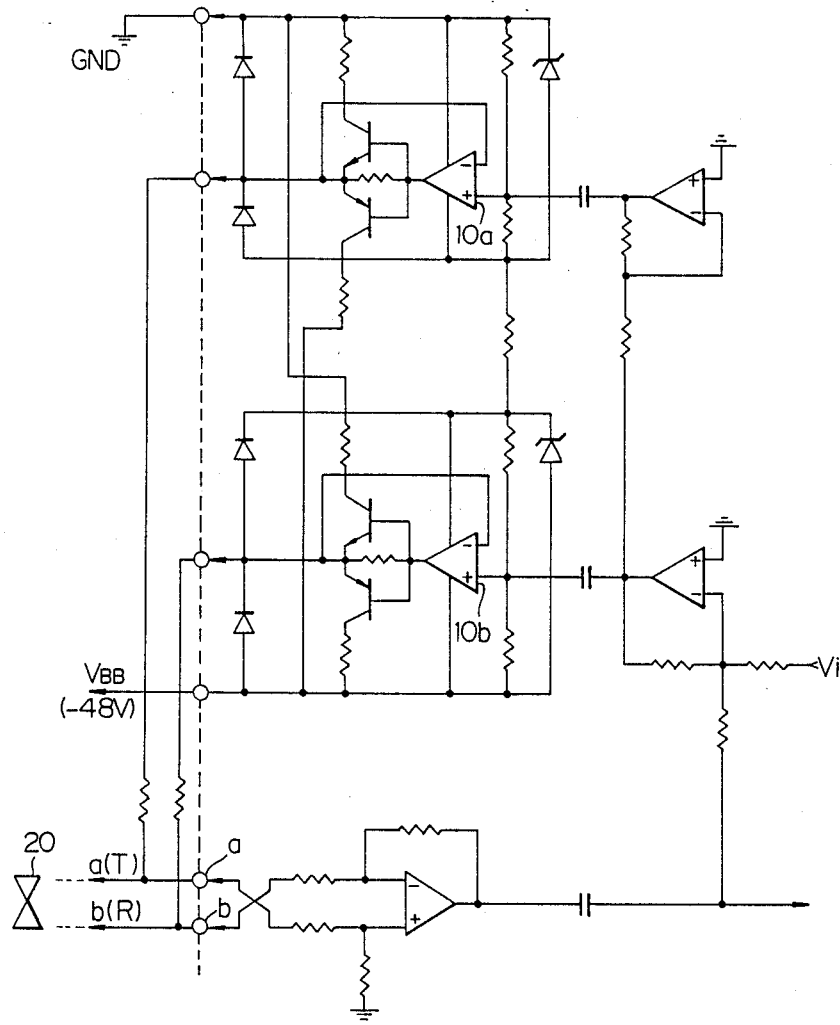
FIG. 8 is a view of an example of a circuit to which the operational amplifier of the present invention is applied.

FIG. 8 is a view of an example of a circuit to which the operational amplifier of the present invention is applied. This is a circuit known as a subscriber line interface circuit and is completely the same as the circuit shown in FIG. 6 of U.S. Pat. No. 4,387,273 (Ramon C. W. Chea. Jr., Monroe Conn). The operational amplifier 10 of the present invention can be applied for the operational amplifiers 10a and 10b in FIG. 8. The characters a and b in the figure mean a relationship with the so-called line a and line b. Connection is through these line a and line b to the subscriber's telephone set 20. Further, $V_i$ shown at the bottom right of the figure is a voice signal which is sent to and received from an exchange (not shown).

As explained above, according to the present invention, the following six effects can be simultaneously expected:

(1) First, the voltage range of the input signal is expanded. According to FIG. 5, operation is possible even if the input signal IN reaches a level of about $-0.2$ V from the ground GND. That is, the input of the inverting input IN ($-$) becomes $V_{BE21} - V_{CE21} - V_{BE1}$ with respect to the ground GND. If $V_{BE21}$ is almost equal to $V_{BE1}$, the input becomes $-V_{CE21}$ and the transistor Q21 can operate up to a level close to the saturation state. The same applies to the non-inverting input IN ($+$). Note that $V_{CE}$ designates the collector-emitter voltage of a transistor and that $V_{BE}$ designates the base-emitter voltage of a transistor, the numerals attached to each such designation referring to the reference numerals of the respective transistors.

(2) Looking at the output amplitude, in FIG. 5, an output of a level of approximately $-0.2$ V from the ground GND is obtained. This $-0.2$ corresponds to $V_{BE22} - V_{CE22} - V_{BE7}$. Here, $V_{BE22}$ and $V_{CE22}$ are base-emitter voltages and collector-emitter voltages of the transistor Q22, while $V_{BE7}$ is the base-emitter voltage of the transistor Q7.

(3) The Early effect is not produced and the circuit operation is stable.

(4) The idling power can be made small.

(5) Stoppage of the power by the TTL level is easy and on-off control of the idling current is easy.

(6) Speaking in general, an operational amplifier which operates between GND and $V_{BB}$ is advantageous in a subscriber line interface circuit of an exchange, etc. If, for example, in FIG. 5, the operational amplifier is given a higher withstand voltage and made able to directly operate between $V_{CC}$ and $V_{BB}$ (about 53 V), wider operating ranges of both the inputs and outputs can be obtained compared with those of the operational amplifier of the present invention. However, for a subscriber line interface circuit, it is more convenient that the operating range be limited to between GND and $V_{BB}$ in view of the required cooperation with other circuits. Further, it is possible to form an operational amplifier with transistors of a withstand voltage of GND$-V_{BB}$, and thus lower than $V_{CC} - V_{BB}$.

We claim:

1. An operational amplifier for producing an output signal representing the voltage differential between two input signals, the operational amplifier being connected to first, second and third power sources, the first, second and third power sources respectively having high, intermediate and low output voltage levels, and comprising:
   a constant current source connected to the first power source and producing therefrom a constant current output;
   voltage buffer means for receiving the constant current output of the constant current source and producing a constant current output of substantially the same value as the constant current of, and received thereby from, the constant current source, the voltage buffer means being connected to the second power source and separating the constant current source from the third power source;
   amplifier means, connected between the voltage buffer means and the third power source, for receiving the constant current output of the voltage buffer means and comprising a differential amplifier responsive to the two input signals for producing an output signal representing the voltage differential between the two input signals; and
   an output circuit connected to the differential amplifier for receiving the output signal therefrom and producing the voltage differential output signal of the operational amplifier.

2. An operational amplifier according to claim 1, wherein the output circuit is connected between the second and third power sources.

3. An operational amplifier according to claim 1, wherein:
   the second power source supplies a power output at ground voltage level;
   the first power source supplies a power output at a positive voltage with respect to the ground voltage level; and
   the third power source supplies a power output at a negative voltage with respect to the ground voltage level.

4. An operational amplifier according to claim 1, wherein the output circuit is an emitter-follower circuit.

5. An operational amplifier according to claim 1, wherein said amplifier means comprises:
   a voltage gain circuit connected between said voltage buffer means and the third power source and receiving the constant current output of the voltage buffer means, and providing a predetermined gain to the output signal of the differential amplifier and supplying same to the output circuit.

6. An operational amplifier according to claim 5, wherein:
   the differential amplifier has inverting and non-inverting input terminals respectively receiving the two input signals, and receiving the constant current output from the voltage buffer means as a bias signal; and the voltage gain circuit receives the constant current output from the voltage buffer means as a bias signal.

7. An operational amplifier according to claim 5, wherein the voltage buffer means comprises:
a first transistor having base, collector and emitter terminals, the base terminal connected to the second power source, and the emitter and collector terminals respectively connected to the constant current source and to the differential amplifier for receiving the constant current output of the constant current source and producing the constant current output of substantially the same value and supplying same to the differential amplifier as a bias signal; and
a second transistor having base, collector and emitter terminals, the base terminal connected to the second power source, and the emitter and collector terminals respectively connected to a constant current source and to the voltage gain circuit for receiving the constant current output of the constant current source and producing the constant current output of substantially the same value and supplying same to the voltage gain circuit as a bias signal.

8. An operational amplifier according to claim 1, wherein the voltage buffer means comprises:
a transistor having base, collector and emitter terminals, the base terminal being connected to the second power source and the emitter and collector terminals respectively being connected to the constant current source and the amplifier means, for receiving the constant current output of the constant current source at the emitter terminal and producing a constant current output of substantially the same value at the collector terminal thereof and supplying same to the amplifier means.

9. An operational amplifier according to claim 1, wherein the constant current source comprises:
a current mirror circuit connected to the first power source and having an output connection at which the constant current output thereof is produced, for supply to the amplifier means; and
switch means connected between the current mirror circuit and the second power source and selectively operable for switching the current mirror circuit on and off and thereby to switch on and off the supply of the constant current output to the amplifier means and correspondingly to turn the operation thereof on and off.

10. An operational amplifier connected to first, second and third direct current power sources, the second thereof having a ground voltage level and the first and third thereof respectively having positive and negative voltage levels relative to the ground voltage level, for supplying a direct current voltage level to a pair of telephone subscriber lines, the operational amplifier comprising:

a constant current source connected to the first, positive voltage power source for producing therefrom a constant current output;
voltage buffer means connected to the second, ground level power source for receiving the constant current output of the constant current source and producing a constant current output of substantially the same value as the constant current received from the constant current source;
amplifier means connected between the voltage buffer means and the third, negative voltage power source for receiving the constant current output of the voltage buffer means and comprising a differential amplifier, responsive to two input signals, for producing an output signal representing the voltage differential between the two input signals; and
an output circuit connected between the second and third power sources, the output circuit further being connected to the differential amplifier for receiving the output signal therefrom and producing the voltage differential output signal of the operational amplifier.

11. An operational amplifier according to claim 10, wherein the negative voltage level of the third direct current power source, relative to the ground voltage level of the second direct current power source, corresponds to the direct current voltage level to be supplied to the pair of telephone subscriber lines.

12. An operational amplifier connected to first, second and third direct current power sources, the second thereof having a ground voltage level and the first and third thereof respectively having positive and negative voltage levels relative to the ground voltage level, for supplying a direct current voltage level to a pair of telephone subscriber lines, the operational amplifier comprising:
first means, connected to the first power source, for producing therefrom a constant current output;
second means, connected to the second power source, for receiving the constant current output of the first means and producing as constant current output of substantially the same value as the constant current output of the first means;
third means, connected between the second means and the third power source, for receiving the constant current output from the second means and responsive to two input signals for producing an output signal representing the voltage differential between the two input signals; and
fourth means, connected between the second and third power sources, for receiving the voltage differential output signal of the third means and producing therefrom the differential output signal of the operational amplifier.

13. An operational amplifier according to claim 12, wherein the negative voltage level of the third direct current power source, relative to the ground voltage level of the second direct current power source, corresponds to the direct current voltage level to be supplied to the pair of telephone subscriber lines.

* * * * *